(12) United States Patent
Eikyu et al.

(10) Patent No.: US 12,159,934 B2
(45) Date of Patent: Dec. 3, 2024

(54) SEMICONDUCTOR DEVICE

(71) Applicant: RENESAS ELECTRONICS CORPORATION, Tokyo (JP)

(72) Inventors: Katsumi Eikyu, Tokyo (JP); Atsushi Sakai, Tokyo (JP); Yotaro Goto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 415 days.

(21) Appl. No.: 17/722,788

(22) Filed: Apr. 18, 2022

(65) Prior Publication Data

US 2023/0335635 A1 Oct. 19, 2023

(51) Int. Cl.
*H01L 29/78* (2006.01)
*H01L 29/06* (2006.01)
*H01L 29/10* (2006.01)
*H01L 29/40* (2006.01)

(52) U.S. Cl.
CPC ...... *H01L 29/7816* (2013.01); *H01L 29/0653* (2013.01); *H01L 29/1095* (2013.01); *H01L 29/402* (2013.01)

(58) Field of Classification Search
None
See application file for complete search history.

(56) References Cited

U.S. PATENT DOCUMENTS

| 2009/0057731 A1* | 3/2009 | Kitajima | H01L 29/1037 257/288 |
| 2018/0026134 A1* | 1/2018 | Eikyu | H01L 29/4238 257/330 |

OTHER PUBLICATIONS

F. Jin et al., "Best-in-class LDMOS with ultra-shallow trench isolation and p-buried layer from 18 V to 40 V in 0.18μm BCD technology," 2017 29th International Symposium on Power Semiconductor Devices and IC's (ISPSD), 2017, pp. 295-298.

* cited by examiner

*Primary Examiner* — William C Trapanese
(74) *Attorney, Agent, or Firm* — Rimon P.C.

(57) ABSTRACT

A semiconductor device includes a semiconductor substrate, a first source region and a first drain region each formed from an upper surface of the semiconductor substrate, a first gate electrode formed on the semiconductor substrate between the first source region and the first drain region via a first gate dielectric film, a first trench formed in the upper surface of the semiconductor substrate between the first gate dielectric film and the first drain region in a gate length direction, a second trench formed in the upper surface of the semiconductor substrate between the gate dielectric film and the first drain region in the gate length direction, the second trench being shallower than the first trench, and a first dielectric film embedded in the first trench and the second trench. The first trench and the second trench are in contact with each other in a gate width direction.

5 Claims, 9 Drawing Sheets

SEMICONDUCTOR DEVICE

BACKGROUND

The present invention relates to a semiconductor device and is suitable for use, for example, in a semiconductor device having a field-effect transistor having a dielectric film in a trench in a surface of a semiconductor substrate between source and drain.

As one of MOSFET (Metal-Oxide-Semiconductor Field Effect Transistor), LDMOSFET (Laterally Diffused MOSFET, the lateral diffusing MOSFET, LDMISFET, hereinafter, simply referred to as "LDMOS") is known.

There are disclosed techniques listed below.
[Non-Patent Document 1] F. Jin et al., "Best-in-class LDMOS with ultra-shallow trench isolation and p-buried layer from 18 V to 40 V in 0.18 µm BCD technology," 2017 29th International Symposium on Power Semiconductor Devices and IC's (ISPSD), 2017, pp. 295-298

Non-Patent Document 1 discloses an LDMOS with a relatively shallow STI (Shallow Trench Isolation) formed on the same chip and separately formed from the deep STI.

SUMMARY

In LDMOS of relatively high withstand voltage, it is conceivable to place an STI (Shallow Trench Isolation) in the offset layer and adopt a structure on which the gate electrode rides. While this structure is easy to withstand voltage design, it is generally disadvantageous in terms of low resistance because the current path in the offset layer becomes longer due to the presence of STI. In particular, the lower the withstand voltage of LDMOS, the greater the effect of the current path on the offset layer resistance in the on-state. In addition, it is necessary to avoid complicating of the manufacturing process. Therefore, it is required to realize a low-cost and low-on-resistance high performance LDMOS.

Other objects and novel features will become apparent from the description of this specification and the accompanying drawings.

The typical ones of the embodiments disclosed in the present application will be briefly described as follows.

A semiconductor device according to one embodiment includes a semiconductor substrate having a first region, a first semiconductor region having a first conductivity type and formed from an upper surface of the semiconductor substrate over a predetermined depth in the first region, a first source region and a first drain region each having a second conductivity type different from the first conductivity type and each formed from the upper surface of the semiconductor substrate to a depth shallower than the first semiconductor region, a first gate electrode formed on the semiconductor substrate provided with the first semiconductor region via a first gate dielectric film and formed on the semiconductor substrate between the first source region and the first drain region, a first trench formed in the upper surface of the semiconductor substrate between the first gate dielectric film and the first drain region in a gate length direction of the first gate electrode, a second trench formed in the upper surface of the semiconductor substrate between the gate dielectric film and the first drain region in a gate length direction of the first gate electrode and is shallower than the first trench and a first dielectric film embedded in the first trench and the second trench, and the first trench and the second trench are in contact with each other in a gate width direction of the first gate electrode.

DETAILED DESCRIPTION

Figure 1:
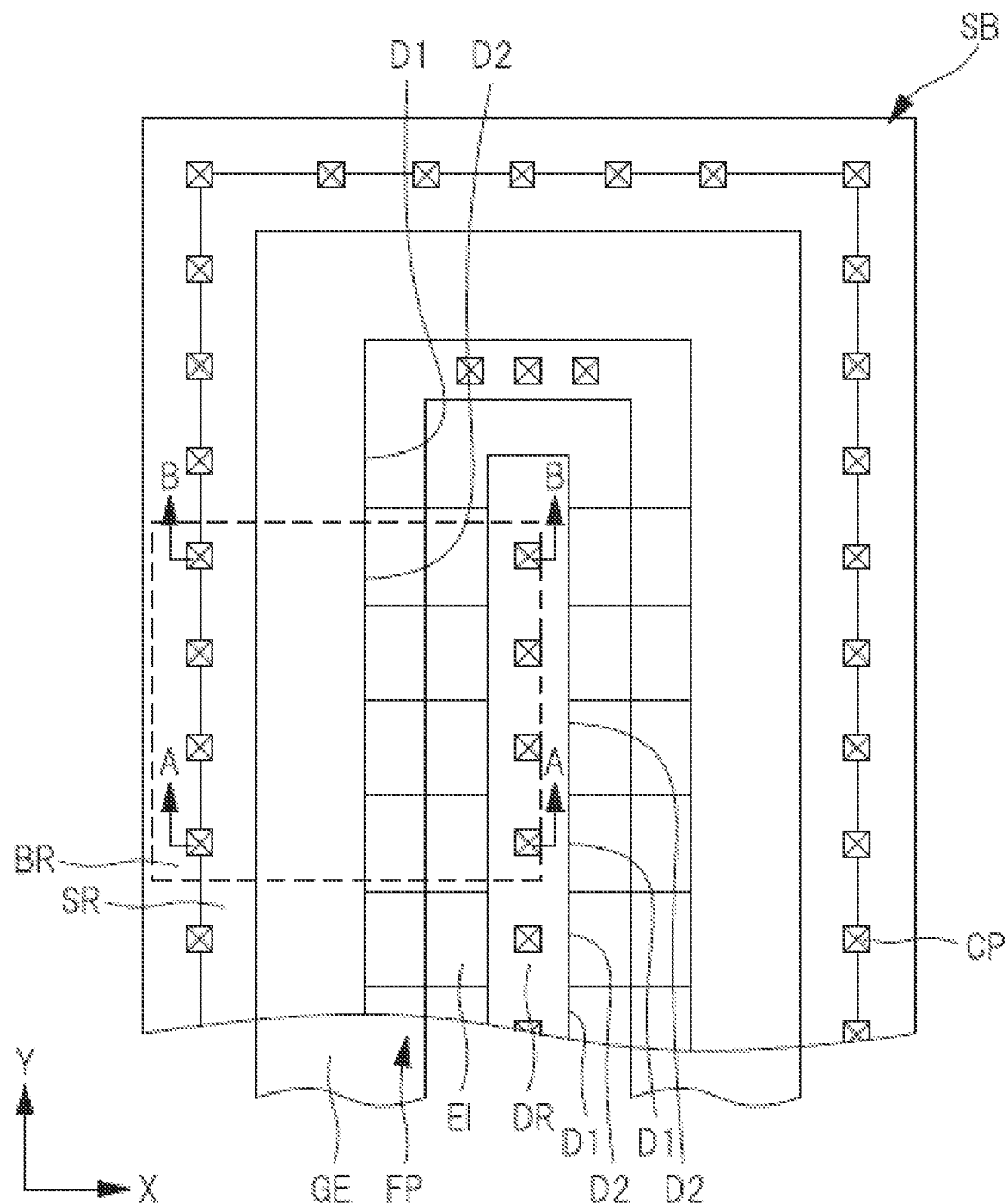
FIG. 1 is a plan view of a semiconductor device according to present embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Further, the reference numerals "−" and "+" represent relative concentration of n-type or p-type impurities, for example, in the case of n-type impurities, the impurity concentration increases in the order of "$n^{--}$", "$n$", "$n^{-}$".

Figure 2:
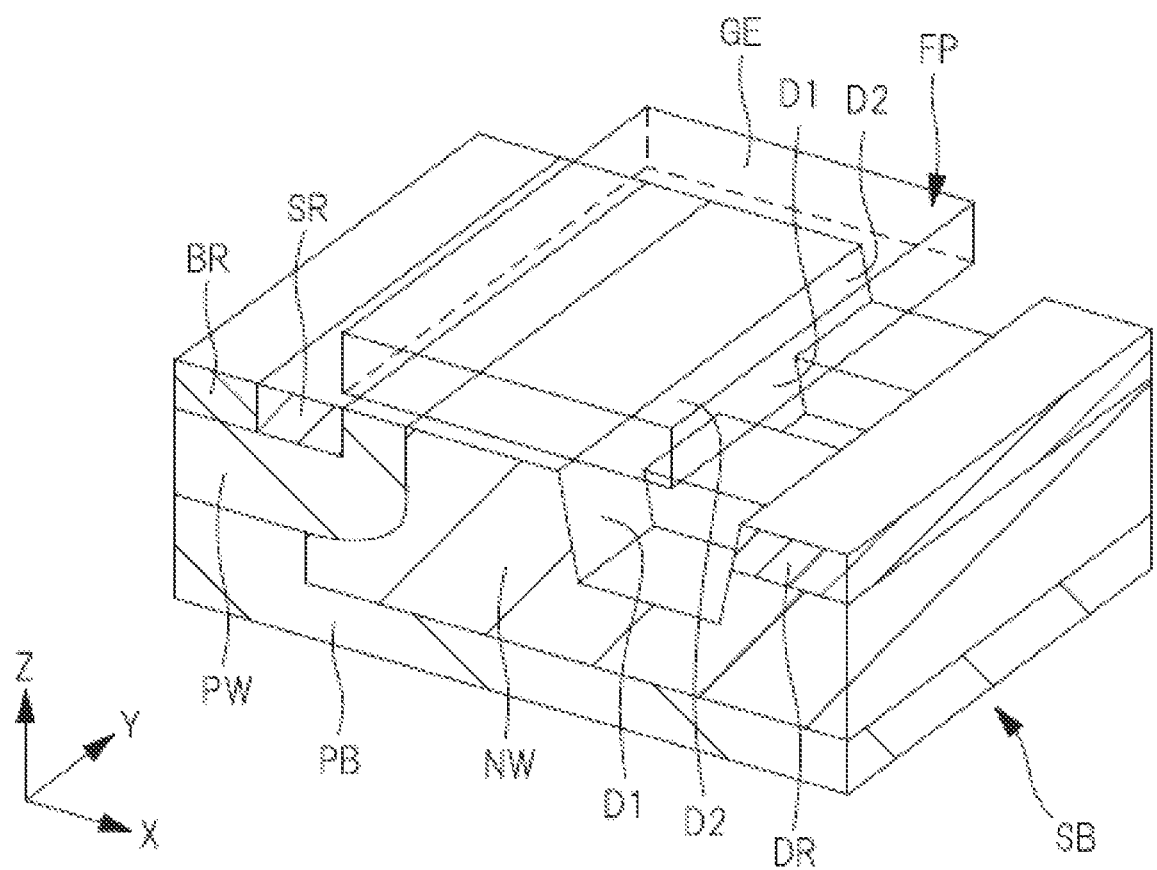
FIG. 2 is a perspective view of a semiconductor device according to the present embodiment.
Figure 3:
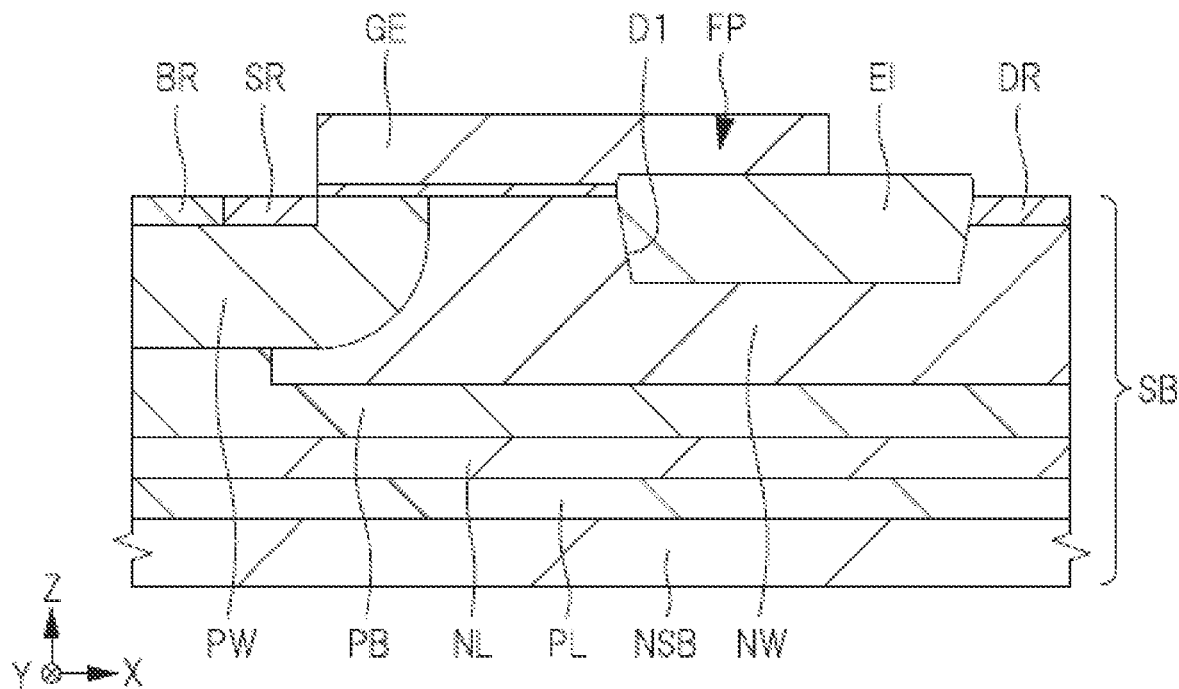
FIG. 3 is a cross-sectional view in line A-A of FIG. 1.
Figure 4:
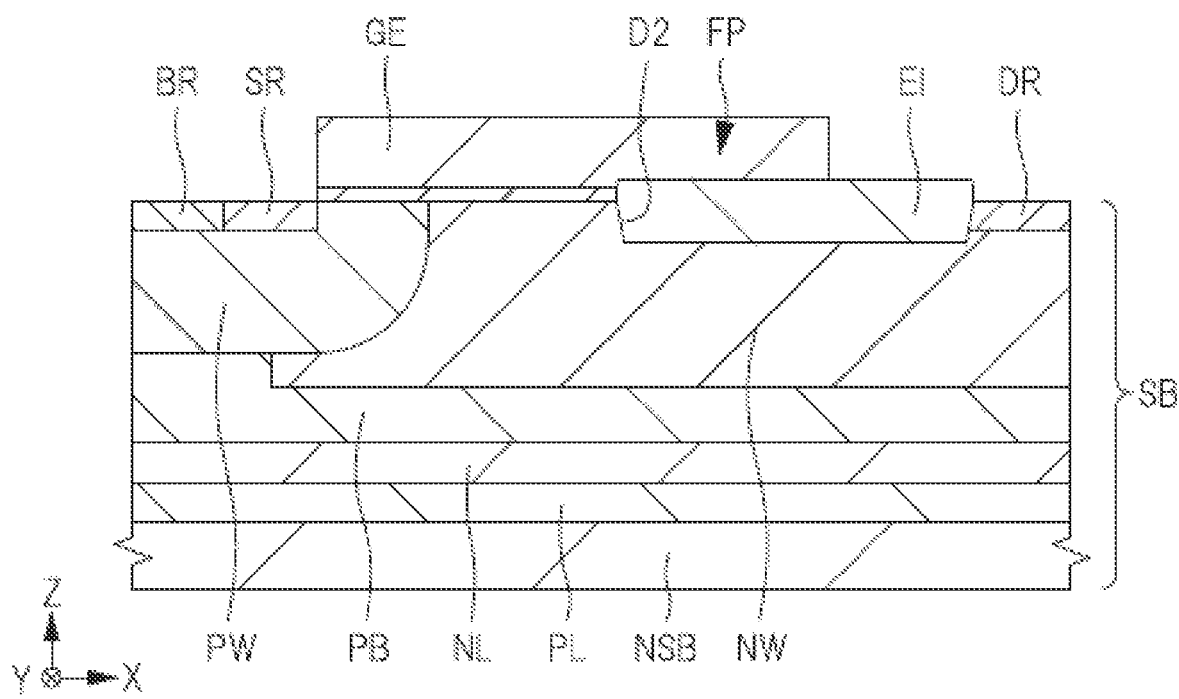
FIG. 4 is a cross-sectional view in line B-B of FIG. 1.

Structure of Semiconductor Device Hereinafter, a structure of a semiconductor device of the present embodiment will be described with reference to FIGS. 1 to 5. FIG. 1 is a plan view showing a semiconductor device according to the present embodiment. FIG. 2 is a perspective view showing a semiconductor device according to the present embodiment, and is a perspective view in the region shown by a broken line in FIG. FIG. 3 is a cross-sectional view showing a semiconductor device according to the present embodiment and is a cross-sectional view in line A-A of FIG. 1. FIG. 4 is a cross-sectional view showing a semiconductor device according to the present embodiment and is a cross-sectional view in line B-B of FIG. 1. The semiconductor device according to the present embodiment is a semiconductor device having an n-channel type LDMOS transistor. Incidentally, LDMOS transistor (field-effect transistor) is sometimes referred to as a lateral power MOSFET. The LDMOS is driven, for example, at 12 V to 80 V.

The semiconductor device according to the present embodiment, as shown in FIG. 3, is formed on a semiconductor substrate SB including a support substrate NSB and an epitaxial layer (semiconductor layer) PL on the support substrate NSB. The support substrate NSB is an n$^-$-type semiconductor substrate, and the epitaxial layer PL is a p-type semiconducting layer. The support substrate NSB and the epitaxial layer PL are made of, for example, Si (silicon).

In FIG. 1, illustration of interlayer dielectric films, sidewalls and wirings and the like is omitted. In FIG. 2, illustration of contact plugs, interlayer dielectric films, gate dielectric films, element isolation regions, sidewalls and wirings and the like is omitted. In FIGS. 3 and 4, illustration of contact plugs, interlayer dielectric films, sidewalls and wirings and the like is omitted. The structure shown in FIG. 1 shows ½ of one unit cell of an LDMOS, and a similar structure is formed with line symmetry on the underside of the structure shown in FIG. 1. That is, in plan view, the source region SR, the body contact region BR and the gate electrode GE has a rectangular annular structure surrounding the drain region DR. Similarly, in a plan view, the trench formed of the trenches D1 and D2 have a rectangular annular structure surrounding the drain region DR.

In FIG. 1, the element isolation region EI and the trenches D1 and D2 under the gate electrode GE are shown through the gate electrode GE. Further, in FIG. 1, the boundary line (outline) between each other of the trenches D1 and D2 under the element isolation region EI is shown through the element isolation region EI. Further, in FIG. 1, illustration of a semiconductor region (well) formed in the semiconductor substrate SB directly under each of the gate electrode GE and the element isolation region EI. Further, in FIGS. 1 to 4, although the source region SR and the body contact region BR are arranged in the gate length direction of LDMOS, it may be alternately arranged adjacent to each other in the gate width direction (Y direction) of LDMOS. In this case, the width (pitch) of each of the source region SR and the body contact region BR in the Y direction is, for example, the same. Incidentally, the ratio (Wb/Ws) of the pitch Wb of the body contact region BR and the pitch Ws of the source region SR and the ratio (W1/W2) of the pitch W1 of the pitch W1 of the trench D1 and the pitch W2 of the trench D2 in the gate width direction may not be correlated. Further, Wb may not be equal to Ws.

The periphery of one cell of the LDMOS shown in FIG. 1 is surrounded by other element isolation region embedded in the trench formed in an upper surface of the semiconductor substrate SB. The other element isolation region and the annular element isolation region EI shown in FIG. 1 are not in contact with each other and are separated from each other. Therefore, the other element isolation region is formed in the trench which is deeper than the trench D2 and has the same depth as the trench D1. However, since it is spaced apart from the element isolation region EI, there is no need to design considering the connection mode with the trench D2, thereby preventing an increase in the design cost of the semiconductor device.

FIGS. 1-4 show LDMOS formed on a semiconductor substrate. As shown in FIG. 1, the semiconductor device according to the present embodiment has a semiconductor substrate SB, and in an upper surface of the semiconductor substrate SB, that is, in an upper surface of the epitaxial layer PL, a drain region DR which is an n$^+$-type semiconductor region into which n-type impurities (for example, P (phosphorus) or As (arsenic)) are introduced, and a source region SR which is an n$^+$-type semiconductor region into which n-type impurities are introduced, are formed.

In the upper surface of the semiconductor substrate SB between the source region SR and the drain region DR, trenches D1 and D2 are formed in a region close to the drain region DR. The trench D2 has a shallower depth from the upper surface of the semiconductor substrate SB compared to the trench D1. The depth of the trench in the present application is, in the direction (longitudinal direction) perpendicular to the upper surface of the semiconductor substrate SB, a distance from the upper surface (uppermost surface) of the semiconductor substrate SB to the bottom surface of the trench which is a recess portion formed in the upper surface of the semiconductor substrate SB. The trench D1 and the trench D2 are formed in contact with each other in the Y direction, and are arranged alternately in the Y direction. In each of the trenches D1 and D2, the element isolation region EI made of a dielectric film is formed. For example, the element isolation region EI completely embeds the inside of each of the trenches D1 and D2. The depth of the trench D1 is, for example, about 275 nm, and the depth of the trench D2 is shallower than the depth of the trench D1, and is, for example, 100 nm or more.

Here, the ratio of the widths of the trenches D1 and D2 in the Y direction adjacent to the drain region DR in the X direction is 1:1. However, the ratio of the widths of the trenches D1 and D2 in the Y direction is not limited to this, and can be appropriately changed. In other words, W1 may not be equal to W2. The X direction and the Y direction in the present application are directions along the upper surface of the semiconductor substrate SB, and are directions perpendicular to each other in plan view.

A body contact region BR, which is a p$^+$-type semiconductor region into which p-type impurities (e.g., B (boron)) is introduced, is formed in the upper surface of the semiconductor substrate SB on the side opposite to the drain region DR, which is a region adjacent to the source region SR and. Each of the source region SR, the drain region DR and the body contact region BR is formed in the semiconductor region SB with a predetermined depth from the upper surface of the semiconductor substrate SB.

The element isolation region EI has an STI structure, and is, for example, an element isolation film formed of a silicon oxide film. The cross-section of the element isolation region EI has a trapezoidal shape in which the width of the lower surface is smaller than the width of the upper surface. The element isolation region EI is formed so as to surround the drain region DR in plan view.

Although the element isolation region EI is considered to be formed by a LOCOS (LOCal Oxidation of Silicon) structure formed by oxidizing the upper surface of the semiconductor substrate SB, in the present embodiment, the element isolation region EI is formed by STI structure rather than LOCOS structure. The side surface of the element isolation region EI of the STI structure has an inclination angle close to the direction perpendicular to the upper surface of the semiconductor substrate SB as compared with the side surface of the element isolation region of LOCOS structure. Therefore, the corner portion which is a boundary portion between the side surface and the bottom surface of the element isolation region EI has an angle close to a right angle.

The source region SR and the body contact region BR are adjacent to each other, the contact plug (conductive connection) CP is connected to the upper surface of the boundary portion of them. On the upper surface of the semiconductor substrate SB between the drain region DR and the source region SR, the gate electrode GE is formed via a gate dielectric film. In the region adjacent to the drain region DR in the Y direction, the contact plug CP is connected to the upper surface of the gate electrode GE.

As shown in FIGS. 3 and 4, on the epitaxial layer PL, the bottom layer NL which is an n-type semiconductor region is formed. On the bottom layer NL, the body region PB which is a p-type semiconductor region is formed. As shown in FIGS. 2 to 4, an n-well NW, which is an $n^+$-type semiconductor region into which n-type impurities are introduced, is formed on the body region PB from the upper surface of the semiconductor substrate SB to a predetermined depth of the semiconductor substrate SB. On the body region PB, a p-well PW, which is a $p^-$-type semiconductor region into which p-type impurities are introduced, is formed from the upper surface of the semiconductor substrate SB to a predetermined depth of the semiconductor substrate SB. The n-well NW and the p-well PW are formed adjacent to each other. The n-well NW and p-well PW are semiconductor regions shallower than the body region PB. The n-well NW includes an offset region corresponding to an LDD (Lightly Doped Drain) layer for relaxing a lateral potential when a potential is supplied to the drain region DR.

The drain region DR is formed on the upper surface of the n-well NW, each of the source region SR and the body contact region BR is formed on the upper surface of the p-well PW. The n-well NW, in a cross section along the X direction (gate length direction), covers the element isolation region EI, side surface and bottom surface of each of the trenches D1 and D2. The boundary between the n-well NW and the p-well PW is located under the gate electrode GE on the gate dielectric film GF. That is, the p-well PW is formed on the upper surface of the semiconductor substrate SB directly under the gate electrode GE on the gate dielectric film GF. In other words, the gate electrode GE is formed on the semiconductor substrate SB with the p-well PW. When LDMOS is turned on, a channel is formed on the upper surface of the p-well PW directly under the gate electrode GE. A source potential is supplied to the p-well PW and the body region PB via the body contact region BR.

The X direction in the present application is the gate length direction of the gate electrode GE, which is the shortest distance between the source region SR and the drain region DR configuring LDMOS, and the Y direction is the gate width direction of the gate electrode GE. Each of the trenches D1 and D2, in the gate length direction of the gate electrode GE, is formed on the upper surface of the semiconductor substrate SB between gate dielectric film GF and the drain region DR.

On the upper surface of the semiconductor substrate SB between the drain region DR and the source region SR, the gate electrode GE is formed via the gate dielectric film GF. The gate dielectric film GF is made of, for example, a silicon oxide film, and the thickness thereof is, for example, 10 nm to 15 nm. The gate electrode GE is formed so as to be sandwiched between the source region SR and the drain region DR in plan view, the field plate (conductive film) FP which is a part of the gate electrode GE rides on the element isolation region EI.

That is, the gate electrode GE is formed so as to straddle on the element isolation region EI between the source region SR and the drain region DR and on the upper surface of the semiconductor substrate SB exposed from the element isolation region EI in the region of the source region SR side than the element isolation region EI. A portion of the gate electrode GE formed on the element isolation region EI is called a field plate FP. Thus, by extending the field plate FP which is a part of the gate electrode GE on the element isolation region EI on the drain region DR side, under the element isolation region EI, a field plate effect that can relax the electric field can be obtained. The gate electrode GE and the field plate FP are made of a polysilicon film.

The field plate FP need not be part of the gate electrode GE, it may be a conductive film formed on the element isolation region EI. The field plate FP is, for example, a metal film formed over on the element isolation region EI and on the gate electrode GE, and may a metal film electrically connected to the gate electrode GE via a contact plug CP. The gate electrode GE, the source region SR and the drain region DR configure an LDMOS which is an n-channel type high withstand voltage MOSFET.

The gate dielectric film GF is formed on the upper surface of the semiconductor substrate SB exposed from the element isolation region EI, but hardly covers the upper surface of the element isolation region EI, and the gate dielectric film GF may be formed between the upper surface of the element isolation region EI and the gate electrode GE.

Although not shown in FIGS. 2 to 4, the side surfaces of the gate electrode GE are covered by sidewall spacers made of a dielectric film. The sidewall spacer exposes the drain region DR, the source region SR and the body contact region BR. Although not shown, on the upper surface of the semiconductor substrate SB, an interlayer dielectric film mainly formed of a silicon oxide film is formed, the interlayer dielectric film covers the upper surface of the semiconductor substrate SB, the gate electrode GE and the element isolation region EI. The contact plug CP (see FIG. 1) penetrates the interlayer dielectric film and is connected to the wiring (not shown) on the interlayer dielectric film.

One of the main features of the semiconductor device according to the present embodiment is that one cell of the LDMOS has trenches D1 and D2 with different depths, which are arranged adjacently side by side in the Y direction (gate width direction). In other words, LDMOS according to the present embodiment has element isolation regions EI with two levels of depth arranged in the gate width direction. Here, a side (end portion, side surface) of the field plate FP on the drain region side, which is the gate electrode GE on the element isolation region EI, extends over on the trench D1 and on the trench D2 which are arranged alternately in the Y direction (see FIG. 1). That is, the width of the gate electrode GE on the trench D1 in the X direction and the width of the gate electrode GE on the trench D2 in the X direction are the same size.

Figure 5:
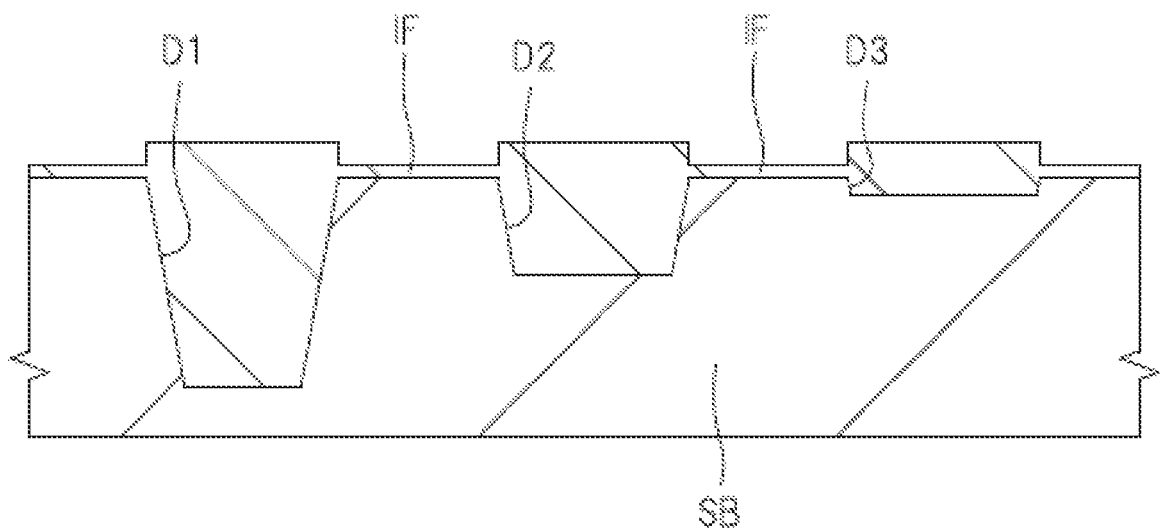
FIG. 5 is a cross-sectional view showing an example of trenches included in an LDMOS which is a semiconductor device according to the present embodiment.

FIG. 5 is a cross-sectional view showing an example of the trenches that LDMOS according to the present embodiment includes. In FIG. 5, the trenches D1, D2 and D3 formed in the upper surface of the semiconductor substrate SB are shown side by side. The trench D2 has a shallower depth than the trench D1, the trench D3 has a shallower depth than the trench D2. The trench D1 has a depth equal to a trench in which an element isolation region is embedded for electrically isolating between a plurality of semiconductor elements (e.g., bipolar transistor or MOSFET) configuring such as a flash memory and a logic circuit which are formed separately from the LDMOS on the semiconductor chip (semiconductor device). In contrast, the trenches D2 or D3 are provided to reduce the resistance of relatively low withstand voltage (e.g., 24 V or 12 V) LDMOS. The withstand voltage of LDMOS according to the present embodiment shown in FIGS. 1 to 4 is, for example, 24 V or 12 V. The depth of the trench D3 and the thickness of the element isolation region formed in the trench D3 is larger than the film thickness of the gate dielectric film GF shown in FIG. 3. Although the three trenches D1, D2 and D3 are shown to be separated from each other for the sake of illustration, in reality, at least two kinds of trenches are formed to be connected to each other in the gate width direction of LDMOS.

The element isolation region EI is embedded in each of the trenches D1 to D3. The upper surface of the semiconductor substrate SB outer of each of the trenches D1 to D3 is covered by a dielectric film IF, and the element isolation region EI is connected to the dielectric film IF. The dielectric film IF is a silicon oxide film configuring a lower layer portion of a hard mask used for forming the trenches D1 to D3.

When the trenches D1 to D3 are formed, for example, a hard mask made of a dielectric film IF and a silicon nitride film on the dielectric film IF is formed on the semiconductor substrate SB. Thereafter, in the first opening region, a portion of the hard mask is opened using a photolithography technique and an etching method, and by dry-etching the semiconductor substrate SB using the hard mask as an etching blocking mask, a trench D1 with the depth d1 is formed in the first opening region. Next, a portion of the hard mask in the second opening region is opened using a photolithography technique and an etching method, and by dry-etching the semiconductor substrate SB using the hard mask as an etching blocking mask, a trench D2 with depth d2 is formed in the second opening region. Since the first opening region is also exposed from the hard mask in this etching step, the depth of the trench D1 is d1+d2.

Next, by opening a portion of the hard mask in the third opening region using a photolithography technique and an etching method, a trench D3 with depth d3 is formed in the third opening region. Since the first opening region and the second opening region are also exposed from the hard mask in this step, the depth of the trench D1 is d1+d2+d3, the depth of the trench D2 is d2+d3. In the case where the trench D3 is not formed as shown in FIGS. 1 to 4, this step is not necessary.

Thereafter, a silicon oxide film is deposited on the semiconductor substrate SB with the trenches D1 to D3 opened by the CVD (Chemical Vapor Deposition) method, thereby embedding the trenches D1 to D3, respectively. Thereafter, the silicon oxide film on the hard mask is removed by a polishing step using a CMP (Chemical Mechanical Polishing) method, the hard mask is exposed. Subsequently, by removing the silicon nitride film configuring the hard mask, a dielectric film IF and an element isolation region EI made of a silicon oxide film embedding each of the trenches D1 to D3 are formed.

In the forming step of the trench D3, even without performing etching for partially removing the semiconductor substrate SB (silicon) after the opening of the third opening region, since the upper surface of the semiconductor substrate SB is recessed by the hard mask removing step of the third opening region and the dielectric film (protruded oxide film) protruded from the dielectric film IF remains after polishing by the subsequent CMP method, the trench D3 which is a recess portion in the upper surface of the semiconductor substrate SB in the third opening portion, and the element isolation region EI on the trench D3 are formed. Since the film thickness of the dielectric film IF is equivalent to the gate dielectric film GF (see FIG. 3), the thickness of the element isolation region EI embedding the trench D3 is larger than the film thickness of the gate dielectric film GF.

Although FIGS. 1 to 4 describe the case where the trenches D1 and D2 are arranged, the trenches D1 and D3 may be arranged side by side or the trenches D2 and D3 may be arranged side by side.

Effect of Semiconductor Device

As the structure of LDMOS, it is considered that the element isolation region having the STI structure formed on the drain region side between the source and the drain is formed at a constant depth in the gate length direction and in the gate width direction. Although such LDMOS is easy withstand voltage design, since the current path in the offset region by the presence of the element isolation region (STI) is long, such LDMOS is generally disadvantageous for low resistance. In addition, the lower withstand voltage of LDMOS, the greater the effect of the current path on the resistance in the offset region in the on-state. That is, if the depth of the element isolation region is only one level, although no particular problem occurs in LDMOS of high withstand voltage (e.g. withstand voltage 45 V or higher), when forming LDMOS of low withstand voltage (e.g. withstand voltage 24 V or less), the problem of increasing on-resistance occurs. However, in LDMOS having no element isolation region (STI), it is difficult to ensure the withstand voltage.

Therefore, there is a problem to realize a technique to prevent an increase in the on-resistance of LDMOS. And, complexity of manufacturing process must be avoided, and realization of low-cost and high-performance LDMOS is required.

Figure 10:
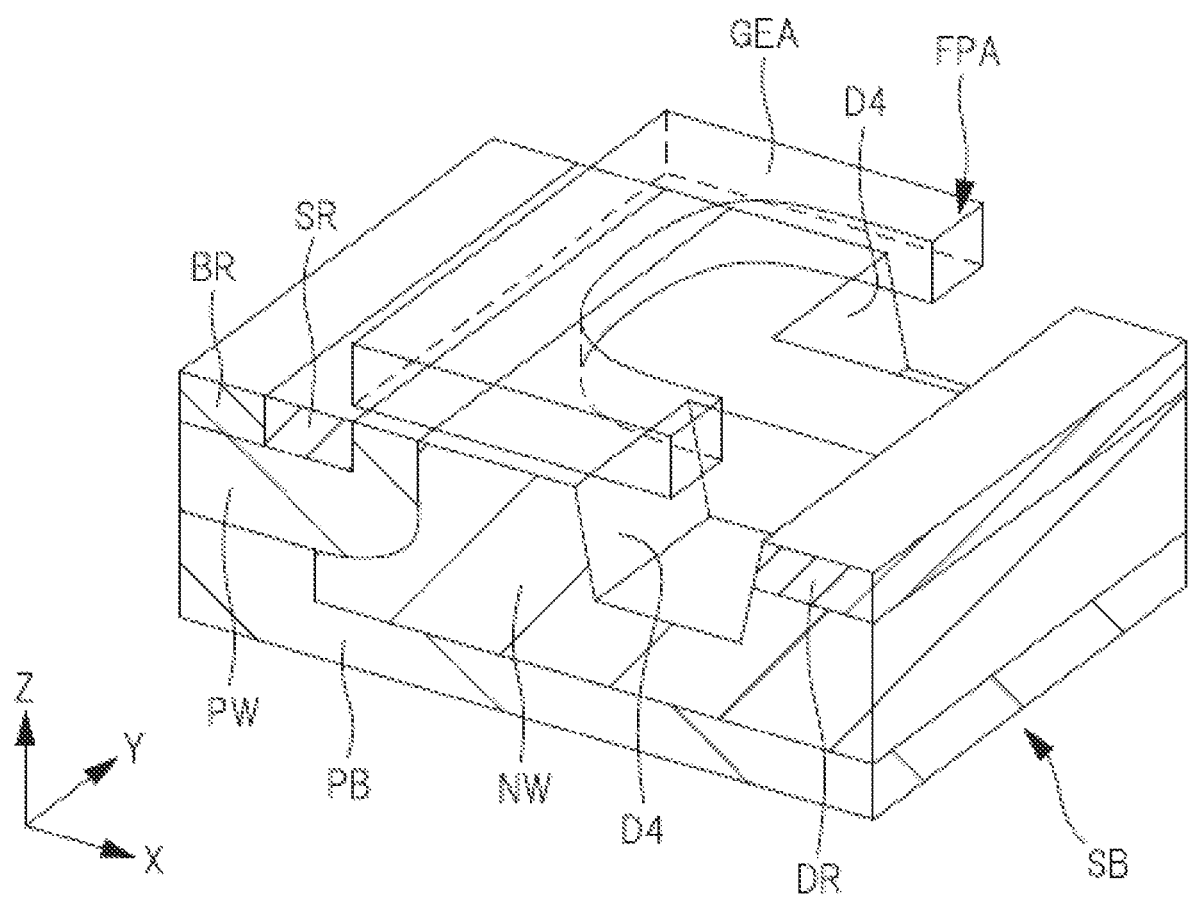
FIG. 10 is a perspective view of a comparative semiconductor device.

Here, as shown as a comparative example in FIG. 10, it is considered that the trench D4 embedding the element isolation region of LDMOS (not shown) is intermittently arranged in the gate width direction of LDMOS. That is, in the comparative example, in one cell of LDMOS, a plurality of trenches D4 formed on the drain region DR side between the source and the drain is formed separately from each other in the Y direction, and element isolation regions having STI structures are formed in the respective trenches D4. At this time, the trench is not formed in the upper surface of the semiconductor substrate SB between the trenches D4 arranged each other in the Y direction, it is not formed even element isolation region. By arranging the formation regions of the element isolation regions in this way intermittently, it is considered to prevent the on-resistance increase of LDMOS.

However, in the comparative example, the field plate FPA which is a part of the gate electrode GEA is formed so as to avoid on the region between the trenches D4 arranged each other in the Y direction. This is because when forming the field plate FPA on the semiconductor substrate SB between the trenches D4 arranged each other in the Y direction, the electric field in the dielectric film between the semiconductor substrate SB and the field plate FP (not shown) is increased, causing problems such as dielectric breakdown.

In the comparative example shown in FIG. 10, since the field plate FPA is formed so as to avoid on the semiconductor substrate SB between the trenches D4 arranged each other in the Y direction, there is a possibility that electric field relaxation in the semiconductor substrate SB is insufficient. In addition, since the pattern of the gate electrode GE (field plate FPA) is complex, complex designs are required and there is a problem of increasing the manufacturing cost of the semiconductor device.

In contrast, in the present embodiment, as shown in FIGS. 1 to 4, by forming the trenches D1 and D2 having two levels of depths arranged in the Y direction (the gate width direction), the element isolation region EI having a deep region and a shallow region arranged in the Y direction can be formed. The combination of the trenches adjacent to each other in the Y direction may be any two combinations of the trenches D1 to D3 shown in FIG. 5. Thus, while ensuring the withstand voltage of LDMOS, an increase in the on-resistance of LDMOS can be prevented. Also, when forming a two-level depth trench, since the addition of a mask in lithography requires only one, the increase in the additional step is minimized.

Further, since the element isolation regions that separate the plurality of semiconductor elements (e.g., bipolar transistors or MOSFETs, etc.) configuring the flash memory, the logic circuit, and the like can be formed in the same process as the trench D1 shown in FIGS. 1 to 4, LDMOS of the present embodiment can be formed while maintaining compatibility with those semiconductor elements.

Also, low on-resistance can also be achieved in a wide range of withstand voltage class LDMOS by adjusting the respective depths of the two-level depth trenches arranged in the gate width direction in the cell of LDMOS or adjusting the ratio of the widths of the respective trenches in the gate width direction.

Further, since the structure of the field plate FP (pattern shape) is simple, it is possible to reduce the design cost as compared with the above comparative example.

From the above, the present embodiment achieves high-performance semiconductor device at low-cost with low on-resistance while ensuring withstand voltage.

First Modified Example

Figure 6:
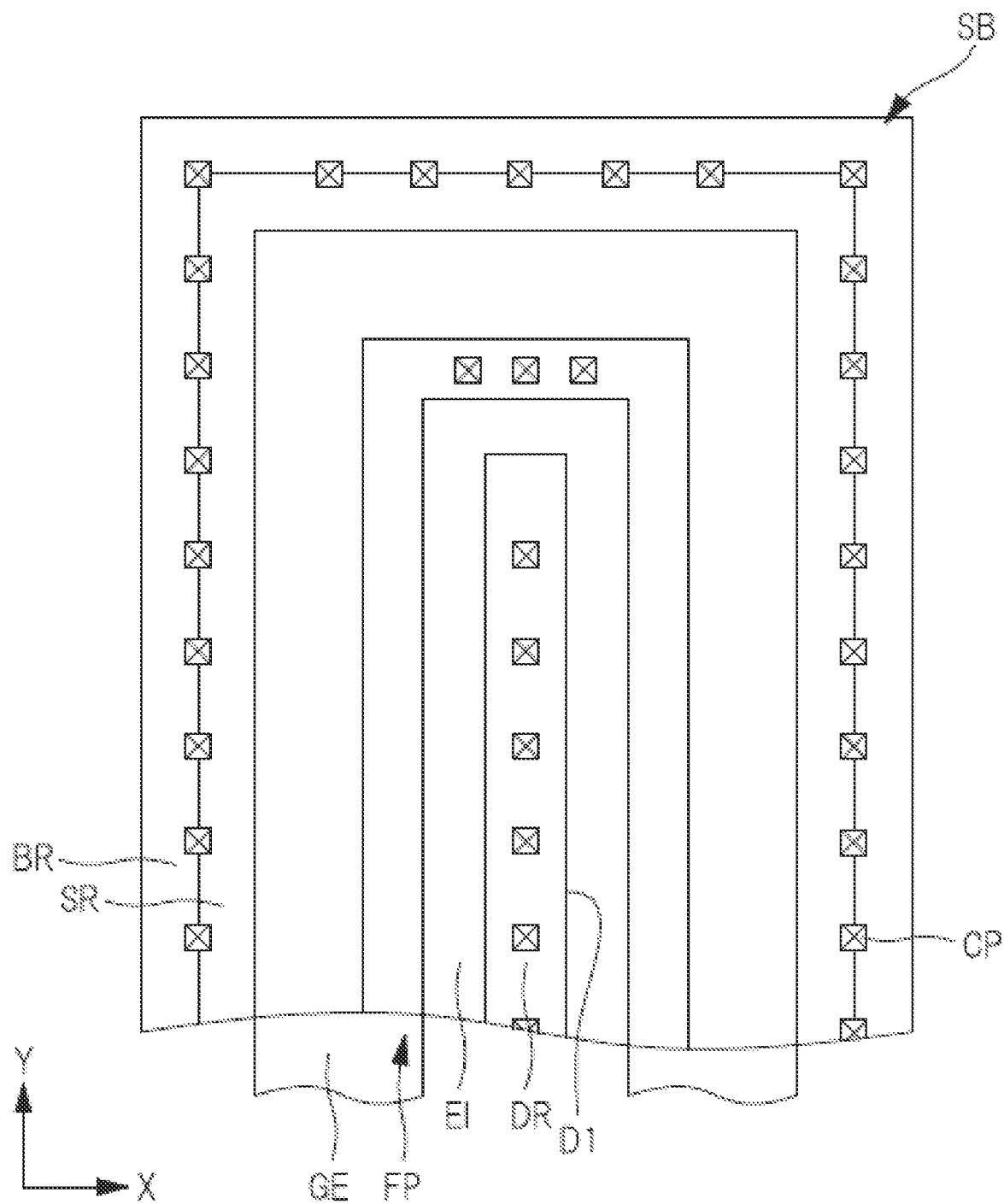
FIG. 6 is a plan view of a semiconductor device according to a first modified example of the present embodiment.
Figure 7:
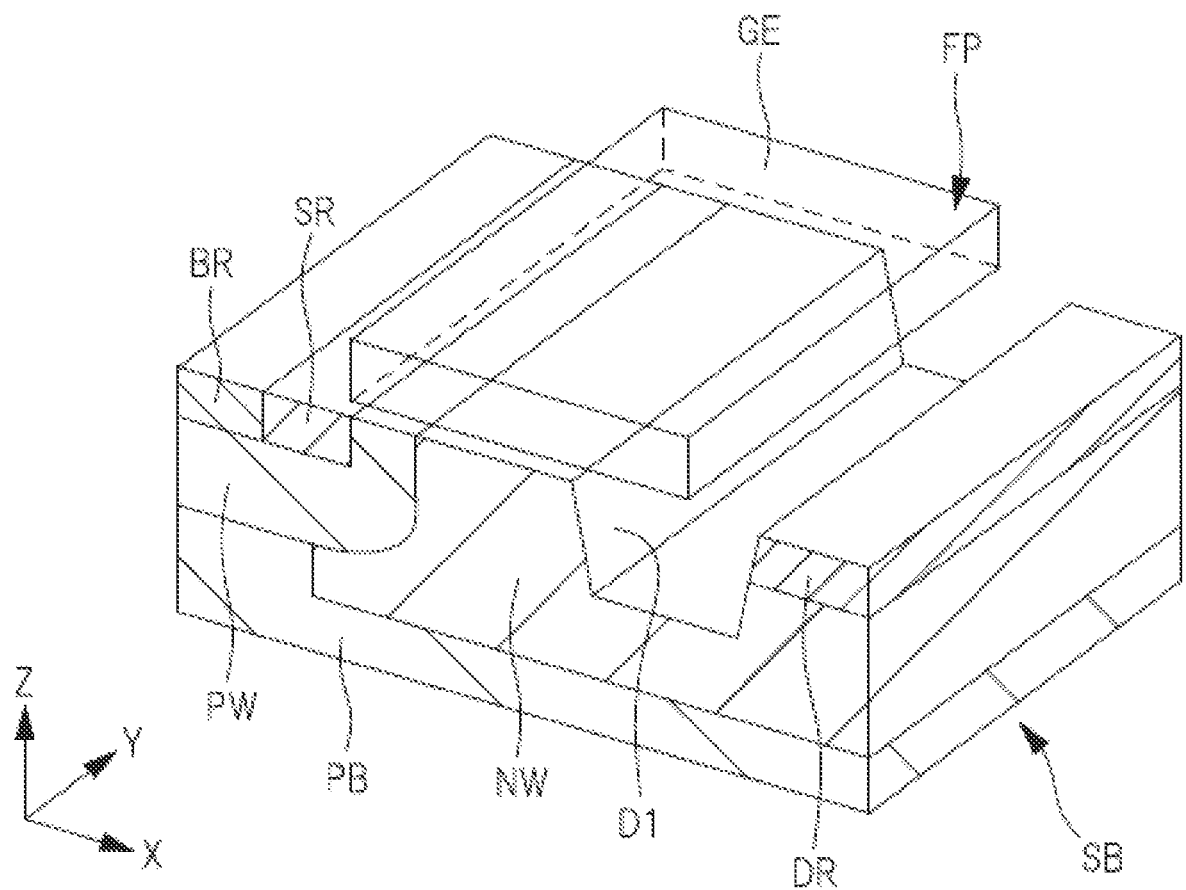
FIG. 7 is a perspective view of a semiconductor device according to a first modified example of the present embodiment.

On the semiconductor chip which is a semiconductor device according to the present embodiment, in addition to LDMOS described with reference to FIGS. 1 to 4, a LDMOS having a withstand voltage different from a withstand voltage of the LDMOS may be formed (mounted). FIGS. 6 and 7 show the second LDMOS of another withstand voltage class mounted on the semiconductor device, separately from the first LDMOS of the semiconductor device according to the present embodiment described with reference to FIGS. 1 to 4. That is, LDMOS shown in FIGS. 1 to 4 is formed in the first region of the semiconductor substrate, and LDMOS shown in FIGS. 6 and 7 is formed in the second region of the semiconductor substrate.

As shown in FIGS. 6 and 7, the second LDMOS has a trench D1 extending with a constant depth in the Y direction (gate width direction) different from the first LDMOS, and an element isolation region EI embedded in the trench D1. Since the trench D1 is deeper than the trench D2, the withstand voltage of the second LDMOS (e.g., 45 V) is higher than the withstand voltage of the first LDMOS (e.g., 24 V).

Thus, when forming a LDMOS having a different withstand voltage class in semiconductor device, by forming an element isolation region matched to the respective LDMOS, it is easy to properly control the on-resistance.

Second Modified Example

Figure 8:
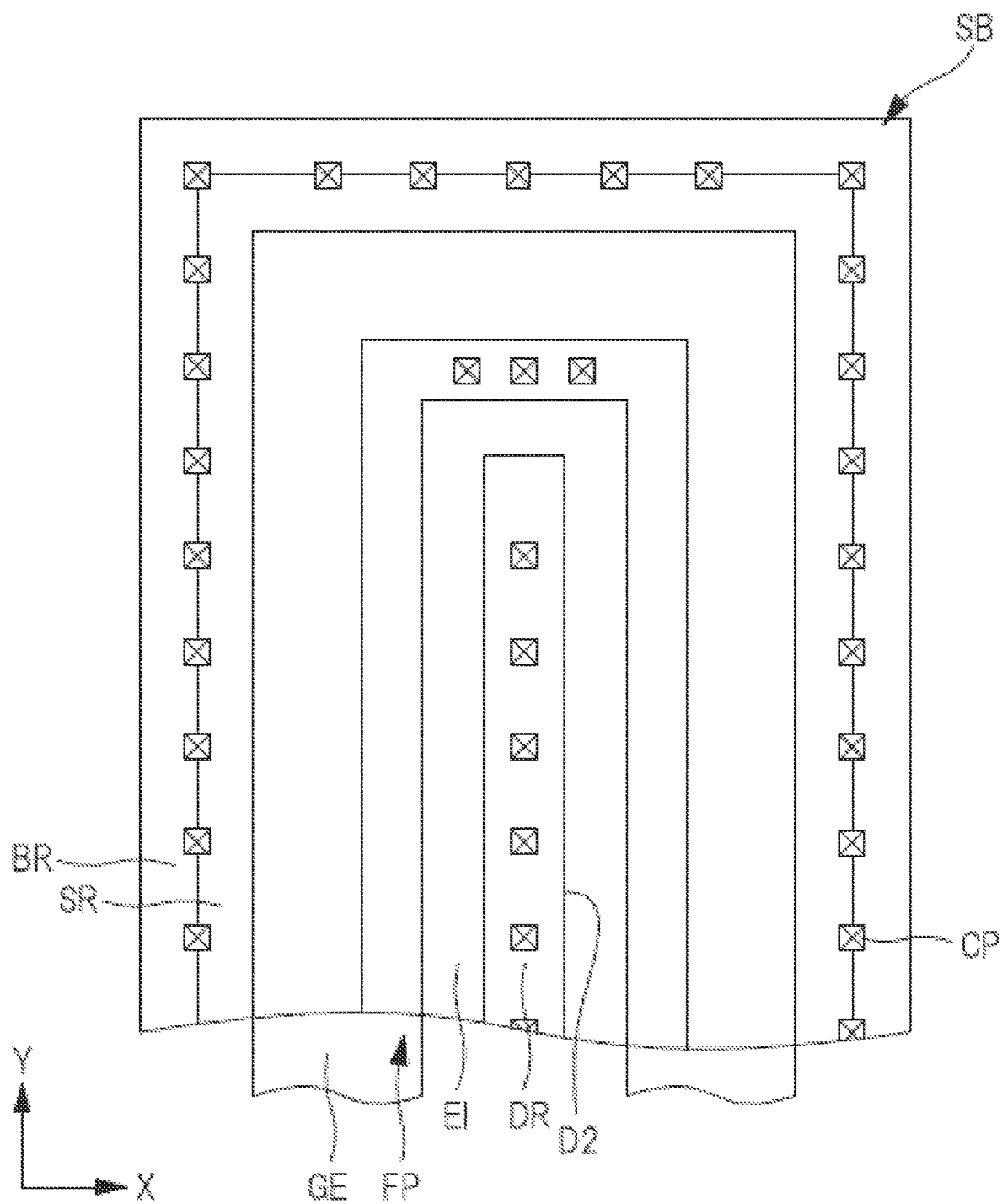
FIG. 8 is a plan view of a semiconductor device according to a second modified example of the present embodiment.
Figure 9:
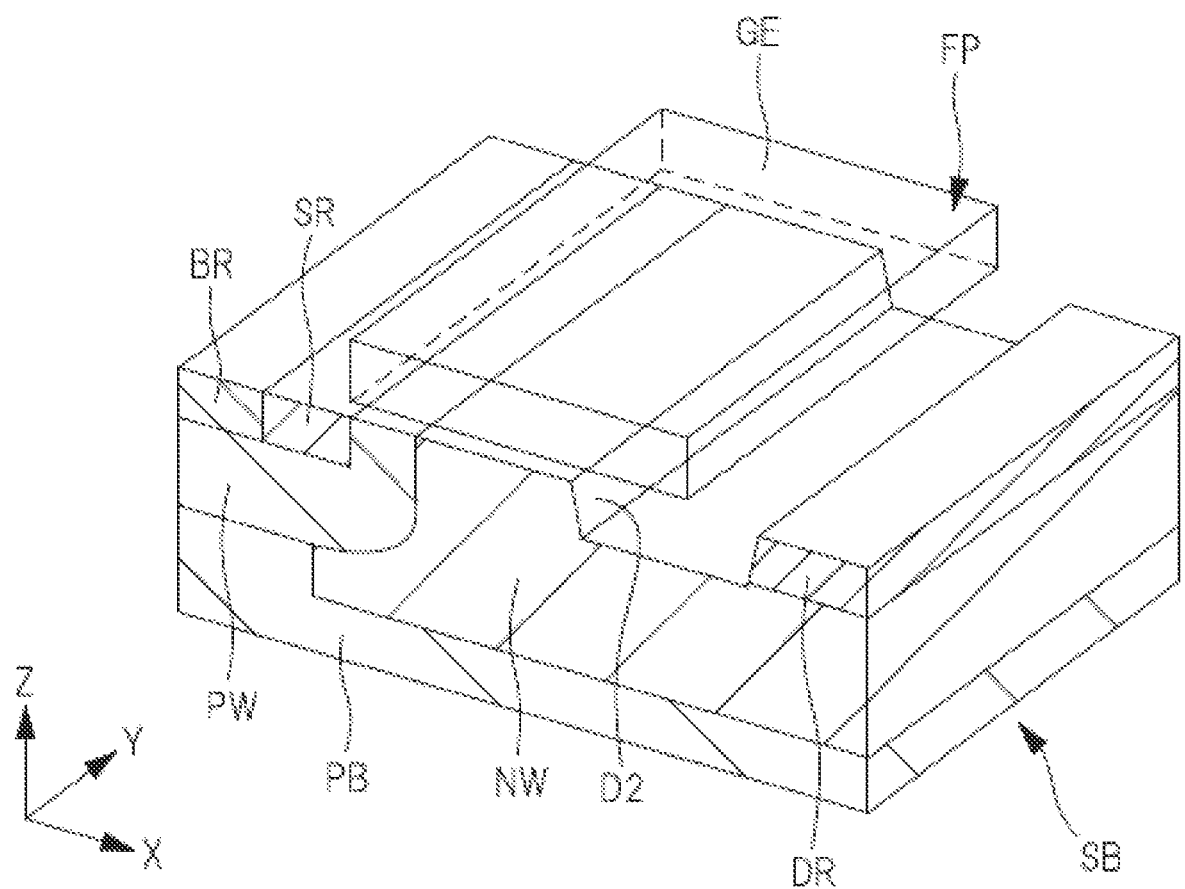
FIG. 9 is a perspective view of a semiconductor device according to a second modified example of the present embodiment.

On the semiconductor chip which is a semiconductor device according to the present embodiment, in addition to LDMOS described with reference to FIGS. 1 to 4, a LDMOS having a withstand voltage different from the above LDMOS may be formed (mounted). FIGS. 8 and 9 show the third LDMOS of another withstand voltage class mounted on the semiconductor device, separately from the first LDMOS of the semiconductor device according to the present embodiment described with reference to FIGS. 1 to 4. That is, LDMOS shown in FIGS. 1 to 4 is formed in the first region of the semiconductor substrate, and LDMOS shown in FIGS. 8 and 9 is formed in the second region of the semiconductor substrate.

As shown in FIGS. 8 and 9, the third LDMOS has the trench D2 extending with a constant depth in the Y direction (gate width direction) unlike the first LDMOS, and an element isolation region EI embedded in the trench D2. Since the trench D2 is shallower than the trench D1, the withstand voltage of the third LDMOS (e.g. 12 V), for example, is smaller than the withstand voltage of the first LDMOS (e.g. 24 V).

Thus, when forming a LDMOS having a different withstand voltage class in semiconductor device, by forming an element isolation region matched to the respective LDMOS, it is easy to properly control the on-resistance.

Although the invention made by the present inventor has been specifically described based on the embodiment, the present invention is not limited to the as described above embodiment, and it is needless to say that various modifications can be made without departing from the gist thereof.

For example, n-type LDMOS has been described as an example in the present embodiment, even p-type LDMOS obtained by inverting the conductivity type of the semiconductor regions, the embodiment can be applied.

Further, forming a trench of two levels of depth in one cell of LDMOS has been described in the above embodiment, it may be formed by arranging trenches having three or more levels of depth in the gate width direction.

What is claimed is:

1. A semiconductor device, comprising:
    a semiconductor substrate having a first region;
    a first semiconductor region having a first conductivity type, the first semiconductor region being formed from an upper surface of the semiconductor substrate over a predetermined depth in the first region;
    a first source region and a first drain region each having a second conductivity type different from the first conductivity type, each of the first source region and the first drain region being formed from the upper surface of the semiconductor substrate to a depth shallower than the first semiconductor region;
    a first gate electrode formed on the semiconductor substrate provided with the first semiconductor region via a first gate dielectric film, the first gate electrode being formed on the semiconductor substrate between the first source region and the first drain region;
    a first trench formed in the upper surface of the semiconductor substrate between the first gate dielectric film and the first drain region in a gate length direction of the first gate electrode;
    a second trench formed in the upper surface of the semiconductor substrate between the gate dielectric film and the first drain region in the gate length direction of the first gate electrode, the second trench being shallower than the first trench; and a first dielectric film embedded in the first trench and the second trench, wherein the first trench and the second trench are in contact with each other in a gate width direction of the first gate electrode.

2. The semiconductor device according to claim 1, comprising:

a conductive film formed on the first dielectric film, the conductive film being extended from the first gate electrode, wherein the conductive film is electrically connected to the first gate electrode, and wherein, in plan view, a side of the conductive film on the first drain region side extends linearly over on the first trench and on the second trench.

3. The semiconductor device according to claim 1, wherein the first trench and the second trench are arranged alternately in the gate width direction.

4. The semiconductor device according to claim 1, comprising:

a second region of the semiconductor substrate, the second region being different from the first region;

a second semiconductor region having the first conductivity type, the second semiconductor region being formed from the upper surface of the semiconductor substrate over a predetermined depth in the second region;

a second source region and a second drain region each having the second conductivity type, each of the second source region and the second drain region being formed from the upper surface of the semiconductor substrate to a depth shallower than the second semiconductor region;

a second gate electrode formed on the semiconductor substrate provided with the second semiconductor region via a second gate dielectric film, the second gate electrode being formed on the semiconductor substrate between the second source region and the second drain region;

the first trench formed in the upper surface of the semiconductor substrate between the second gate dielectric film and the second drain region in a gate length direction of the second gate electrode; and a second dielectric film embedded in the first trench, wherein, in plan view, a region between the second gate dielectric film and the second drain region and the second trench are separated from each other.

5. The semiconductor device according to claim 1, comprising:

a third region of the semiconductor substrate, the third region being different from the first region;

a third semiconductor region having the first conductivity type, the third semiconductor region being formed from the upper surface of the semiconductor substrate over a predetermined depth in the third region;

a third source region and a third drain region each having the second conductivity type, each of the third source region and the third drain region being formed from the upper surface of the semiconductor substrate to a depth shallower than the third semiconductor region;

a third gate electrode formed on the semiconductor substrate provided with the third semiconductor region via a third gate dielectric film, the third gate electrode being formed on the semiconductor substrate between the third source region and the third drain region;

the second trench formed in the upper surface of the semiconductor substrate between the third gate dielectric film and the third drain region in a gate length direction of the third gate electrode; and a third dielectric film embedded in the second trench, wherein, in plan view, a region between the third gate dielectric film and the third drain region and the first trench are separated from each other.

* * * * *